United States Patent
Ikeda (10) Patent No.: US 6,643,217 B2
(45) Date of Patent: Nov. 4, 2003

(54) SEMICONDUCTOR MEMORY DEVICE PERMITTING EARLY DETECTION OF DEFECTIVE TEST DATA

(75) Inventor: Yutaka Ikeda, Hyogo (JP)

(73) Assignee: Mitsubshi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/227,381

(22) Filed: Aug. 26, 2002

(65) Prior Publication Data

US 2003/0165077 A1 Sep. 4, 2003

(30) Foreign Application Priority Data

Mar. 1, 2002 (JP) ......................................... 2002-055235

(51) Int. Cl.$^7$ ................................................. G11C 8/00
(52) U.S. Cl. ......................... 365/233; 365/194; 365/201
(58) Field of Search ................................. 365/233, 194, 365/201, 189.05, 189.08

(56) References Cited

U.S. PATENT DOCUMENTS

| | | | |
|---|---|---|---|
| 5,568,445 A | * 10/1996 | Park et al. | 365/233 |
| 5,966,343 A | * 10/1999 | Thurston | 365/233 |
| 6,151,270 A | * 11/2000 | Jeong | 365/233 |
| 6,327,217 B1 | * 12/2001 | Chung | 365/233 |

* cited by examiner

Primary Examiner—Anh Phung
(74) Attorney, Agent, or Firm—McDermott, Will & Emery (57) ABSTRACT

In a test mode, read data is output from a memory array with each of N latch circuits in an output circuit being set to an operating state under the control of a latency setting circuit. Thus, the data transmission period can be set shorter in the test mode than in a normal data reading operation, and a time required for testing the read data in the test mode is shortened.

6 Claims, 5 Drawing Sheets

SEMICONDUCTOR MEMORY DEVICE PERMITTING EARLY DETECTION OF DEFECTIVE TEST DATA

BACKGROUND OF THE INVENTION

1. Field of the Invention

The present invention relates to semiconductor memory devices taking in external signals such as address signals, timing signals and input data in synchronization with an external clock signal, and more particularly to a semiconductor memory device configured to sequentially read out a plurality of pieces of data in synchronization with a clock signal.

2. Description of the Background Art

With advancement of microprocessor units in recent years, speeding of not only the main frame but also the entire computer system of workstation, personal computer or the like has proceeded. Even a system with an operating frequency exceeding 100 MHz is now available by virtue of the advent of a RISC (restricted instruction set computer) processor. A dynamic random access memory (DRAM) used for a main memory of such a computer system or graphics has undergone downsizing as well as speeding year after year. However, technical advances of the microprocessor units have outrun the speeding of the DRAM, and there is an increasing gap in performance therebetween. By way of speeding the DRAM, a synchronous DRAM dramatically improved in data transferring capability has been developed.

The synchronous DRAM is a synchronous type DRAM which performs command latching and data input/output in synchronization with rising edges of a clock signal being input. Such a synchronous type DRAM offers high-speed operation control by synchronizing with a system clock, generally adopting a pipelined circuit configuration.

The pipelined circuit configuration enables a high-speed operation by dividing the circuitry performing a series of reading operations from address input to data output into blocks, and causing the respective blocks to operate in a multiplexed manner in response to the clock signal.

A three-stage pipelined circuit configuration is now described by way of example.

Assume that a first stage corresponds to a time period from input of an address signal to selection of a column switch; a second stage corresponds to a time period from selection of the column switch to latching of read data; and a third stage corresponds to a time period until the read data is transmitted from an output buffer circuit to an output terminal and its level is settled. These stages are separated from each other in accordance with the clock signal to multiplex the internal operations.

For example, in an operation with a clock signal of 100 MHz, initial data is obtained in a time period within 30 ns corresponding to three clock cycles. Thereafter, data of 10 ns each are output sequentially in respective cycles by virtue of the multiplexed configuration. As such, although the time required for an initial access is equal to that of a conventional normal DRAM, the times required for the succeeding accesses are speeded considerably from those of the normal DRAM, so that data transfer rate dramatically increases. In the three-stage pipelined circuit configuration described above, three cycles are required from the input of a column address to the output of selected data, which is generally called CAS latency 3.

CAS latency indicates the number of clock cycles required from the time when a column address as data read designation is input until the time when valid data becomes ready for output. A column address strobe signal/CAS is utilized as a timing signal for reference, although a row address strobe signal/RAS may be used alternatively.

In the synchronous DRAM, use of a clock signal of an increased frequency is advanced for the purpose of enabling rapid data reading. However, a certain time period is required from the input of a column address to the output of valid data for column select operation, amplification operation and other operations, regardless of the clock frequency.

This means that the CAS latency should be increased to perform data reading using a high-speed clock.

By comparison, a wafer test is generally conducted using a tester which employs a low-speed clock, taking account of the cost. If such a tester of low-speed clock is used for testing a synchronous DRAM designed to conform to a high-speed clock and thus having large CAS latency, it would require a long time from the designation of data reading to the completion of data output, since the synchronous DRAM is a clock synchronous system. In other words, detection of defective test data in the wafer test would take a long period of time.

SUMMARY OF THE INVENTION

An object of the present invention is to provide a semiconductor memory device which allows early detection of defective test data.

The semiconductor memory device of the present invention includes a memory array storing data, a data output circuit, and a latency setting circuit.

The data output circuit transmits read data output from the memory array to a data output node. The latency setting circuit, in response to designation of a data reading operation, controls the operation timing of the data output circuit and adjusts a data transmission period until the read data is transmitted to the data output node. In a test mode, the latency setting circuit sets the data transmission period shorter than in the normal data reading operation.

Thus, the primary advantage of the present invention is that the data transmission period required for outputting read data from a memory array can be set shorter in the test mode than in the normal data reading operation. This permits reduction of the test time of the read data even in a performance test employing a tester of low-speed clock.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described in detail with reference to the accompanying drawings, in which like or corresponding portions are denoted by like reference characters, and description thereof is not repeated.

Figure 1:
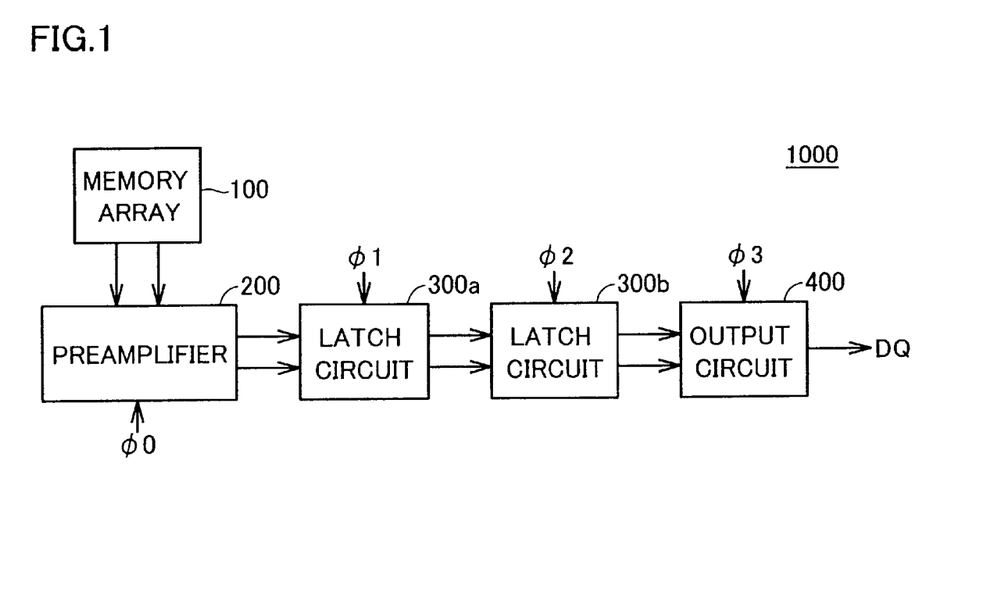
FIG. 1 is a block diagram of a synchronous semiconductor memory device according to an embodiment of the present invention.

Referring to FIG. 1, the synchronous semiconductor memory device 1000 is provided with a memory array 100, a preamplifier 200, latch circuits 300a and 300b, and an output circuit 400.

Memory array 100 has a plurality of memory cells arranged in rows and columns. In response to designation of data reading, complementary two signals (hereinafter, also referred to as "data signals") corresponding to read data stored in memory array 100 are input to preamplifier 200 via data lines. Preamplifier 200, in response to a timing signal φ0, outputs the data signals received from memory array 100 to latch circuit 300a. Latch circuit 300a, in response to a timing signal φ1, latches the data signals received from preamplifier 200, and outputs them to latch circuit 300b. Latch circuit 300b, in response to a timing signal φ2, latches the data signals received from latch circuit 300a, and outputs them to output circuit 400. Output circuit 400, in response to a timing signal φ3, latches the data signals received from latch circuit 300b, and externally outputs the latched data signals as data DQ.

Figure 2:
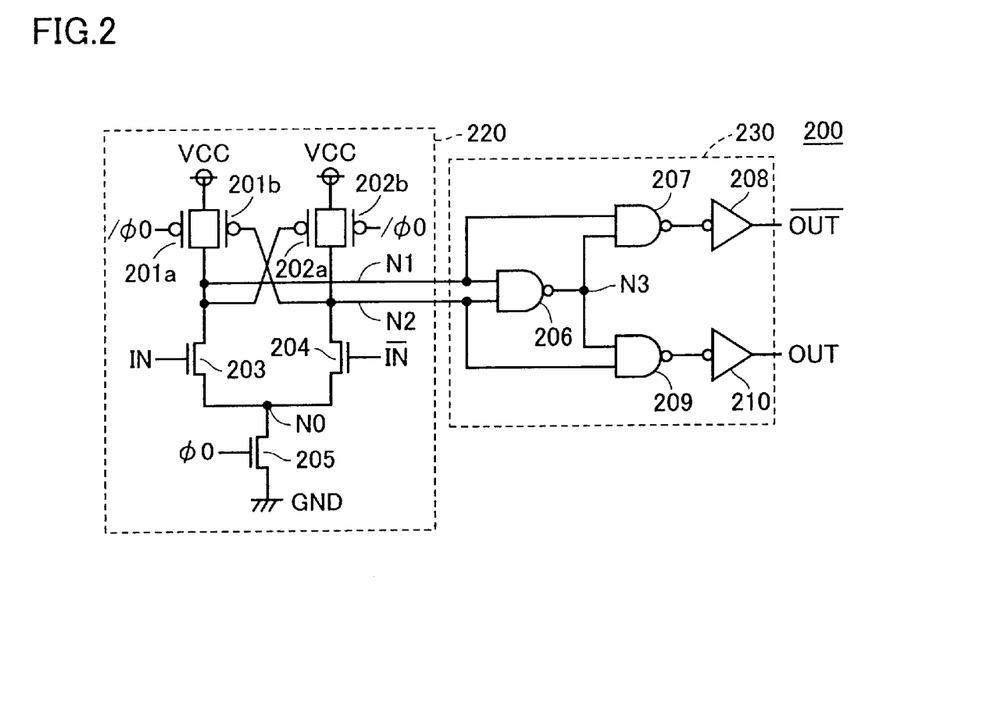
FIG. 2 is a circuit diagram of a preamplifier.

Referring to FIG. 2, preamplifier 200 includes a differential amplifier 220 and a logic circuit 230.

Differential amplifier 220 amplifies a level difference between the complementary signals (data signals), i.e., input signals IN and /IN, transmitted on the data lines corresponding to the read data stored in memory array 100, and outputs the amplified signals to logic circuit 230.

Logic circuit 230 generates output signals OUT and /OUT based on the amplified signals from differential amplifier 220, and outputs them to latch circuit 300a.

Differential amplifier 220 has P channel MOS transistors 201a and 201b, P channel MOS transistors 202a and 202b, and N channel MOS transistors 203–205.

P channel MOS transistors 201a and 201b are arranged in parallel between a power supply voltage VCC and a node N1. P channel MOS transistor 201a has its gate receiving a timing signal /φ0 that is an inverted version of timing signal φ0. P channel MOS transistor 201b has its gate electrically connected to a node N2. N channel MOS transistor 203 is connected between nodes N1 and N0, and has its gate receiving input signal IN.

P channel MOS transistors 202a and 202b are arranged in parallel between power supply voltage VCC and node N2. P channel MOS transistor 202a has its gate electrically connected to node N1. P channel MOS transistor 202b has its gate receiving timing signal /φ0. N channel MOS transistor 204 is connected between nodes N2 and N0, and has its gate receiving input signal /IN. N channel MOS transistor 205 is connected between node N0 and a ground voltage GND, and has its gate receiving timing signal φ0.

An operation of differential amplifier 220 is now described. Differential amplifier 220 attains an active state when timing signal φ0 is at an "H" level, and an inactive state when the signal φ0 is at an "L" level.

It is assumed, by way of example, timing signal φ0 is at an "H" level and complementary input signals IN and /IN are at an "H" level and an "L" level, respectively. At this time, P channel MOS transistor 201b is rendered non-conductive and P channel MOS transistors 202a and 202b are rendered conductive. Thus, nodes N1 and N2 attain voltage levels of "L" level and "H" level, respectively. When complementary input signals IN and /IN are at an "L" level and an "H" level, respectively, nodes N1 and N2 attain voltage levels of "H" level and "L" level, respectively. As such, nodes N1 and N2 have voltages complementary to each other, and their level difference is amplified.

Logic circuit 230 includes NAND circuits 206, 207 and 209, and inverters 208 and 210.

NAND circuit 206 has two inputs receiving voltages of nodes N1 and N2, and outputs their NAND operation result to a node N3. NAND circuit 207 has two inputs receiving voltages of nodes N1 and N3, and outputs their NAND operation result to inverter 208. Inverter 208 inverts the output of NAND circuit 207, and outputs an output signal /OUT.

NAND circuit 209 has two inputs receiving voltages of nodes N3 and N2, and outputs their NAND operation result to inverter 210. Inverter 210 inverts the output of NAND circuit 209, and outputs an output signal OUT.

An operation of logic circuit 230 is now described.

When complementary nodes N1 and N2 are at an "H" level and an "L" level, respectively, output signals OUT and /OUT are at an "L" level and an "H" level, respectively. On the other hand, when nodes N1 and N2 are at an "L" level and an "H" level, respectively, output signals OUT and /OUT are at an "H" level and an "L" level, respectively.

The circuit operation of preamplifier 200 as a whole is activated in receipt of timing signal φ0 (of an "H" level), and the output signals OUT and /OUT are set to have polarities identical to those of respective input signals IN and /IN and to have voltage levels amplified therefrom. That is, when input signals IN and /IN are at an "H" level and an "L" level, respectively, output signals OUT and /OUT are at an "H" level and an "L" level, respectively.

It is noted that output signals OUT and /OUT of preamplifier 200 are each at an "L" level in an initial state.

Figure 3:
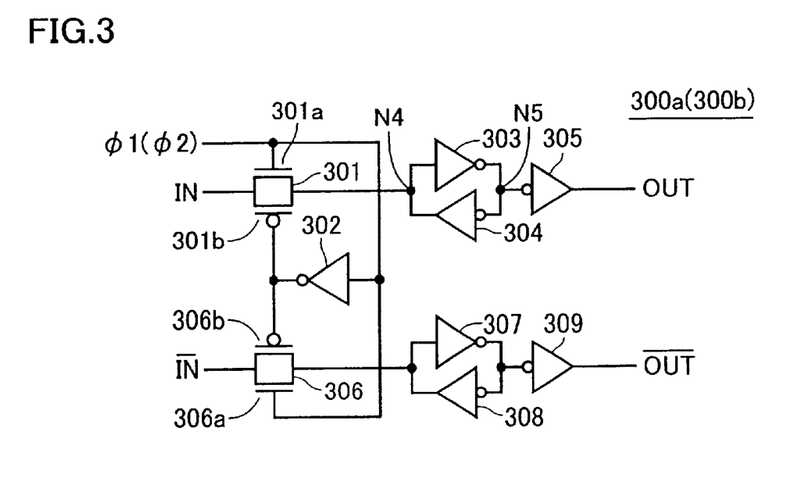
FIG. 3 shows a circuit configuration of a latch circuit.

Referring to FIG. 3, latch circuits 300a and 300b have circuit configurations identical to each other, so that latch circuit 300a is mainly described.

Latch circuit 300a includes transfer gates 301 and 306, and inverters 302–305 and 307–309. Here, transfer gate 301 has an N channel MOS transistor 301a and a P channel MOS transistor 301b. Transfer gate 306 has an N channel MOS transistor 306a and a P channel MOS transistor 306b. Inverters 304 and 308 (hereinafter, referred to as "small inverters") each have driving capability lower than that of a common transistor.

Latch of input signal IN is now described.

Transfer gate 301 forms a gate which transmits input signal IN to node N4. N channel MOS transistor 301a has its gate receiving timing signal φ1. P channel MOS transistor 301b has its gate receiving timing signal φ1 inverted by inverter 302. Inverter 303 receives and inverts a signal input from node N4, and transmits it to a node N5. Small inverter 304 receives and inverts a signal input from node N5 for transmission to node N4. Thus, inverter 303 and small inverter 304 form a latch. Inverter 305 inverts the signal transmitted to node N5, and outputs it as output signal OUT.

As such, transfer gate 301 is rendered conductive in response to timing signal φ1, and inverters 303 and 304 latch a data signal, i.e., input signal IN, and outputs it as output signal OUT. Input signal IN and output signal OUT are identical in polarity to each other.

Input signal /IN is latched in the same manner.

Connection of transfer gate 306 and inverters 302 and 307–309 is as described above, so that description thereof is not repeated.

Transfer gate 306 is rendered conductive in response to timing signal φ1, and input signal/IN as a data signal is latched by inverters 307 and 308 and then output as output signal/OUT.

Latch circuit 300a is activated when timing signal φ1 is at an "H" level. It is inactive when timing signal φ1 is at an "L" level.

By way of example, when input signals IN and/IN are at an "H" level and an "L" level, respectively, output signals OUT and/OUT are latched to an "H" level and an "L" level, respectively.

As such, in response to timing signal φ1, latch circuit 300a latches the data signals of input signals IN and/IN, and outputs them as output signals OUT and/OUT having corresponding polarities.

Likewise, latch circuit 300b latches input signals IN and/IN in response to timing signal φ2, and outputs them as output signals OUT and/OUT of corresponding polarities.

Figure 4:
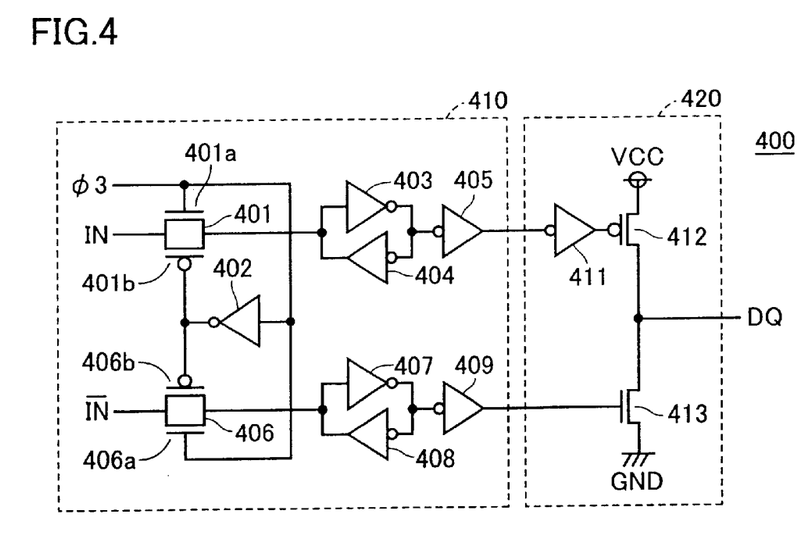
FIG. 4 is a circuit diagram of an output circuit.

Referring to FIG. 4, output circuit 400 is activated in response to timing signal φ3, and latches data signals of input signals IN and/IN, and generates data DQ.

Output circuit 400 includes a latch circuit 410 and an output buffer 420.

Latch circuit 410 has transfer gates 401 and 406, and inverters 402–405 and 407–409. Inverters 404 and 408 are small inverters.

Latch circuit 410 has a configuration identical to that of latch circuit 300a shown in FIG. 3, and latches input signals IN and/IN in response to timing signal φ3.

Output buffer 420 has an inverter 411, a P channel MOS transistor 412 and an N channel MOS transistor 413.

P channel MOS transistor 412 and N channel MOS transistor 413 are connected in series between power supply voltage VCC and ground voltage GND and, from their connection node or a data output node, data DQ is externally transmitted.

P channel MOS transistor 412 has its gate receiving, via inverter 411, an inverted version of input signal IN having been latched by latch circuit 410. N channel MOS transistor 413 has its gate receiving input signal/IN latched by latch circuit 410.

An operation of output circuit 400 is now described.

When timing signal φ3 is at an "H" level, input signals IN and/IN are latched by latch circuit 410 and then output to output buffer 420. At this time, when complementary input signals IN and/IN are at an "H" level and an "L" level, respectively, inverter 411 and the gate of N channel MOS transistor 413 in output buffer 420 receive an "H" level and an "L" level, respectively.

Correspondingly, P channel MOS transistor 412 turns on, and data DQ becomes an "H" level or "1".

On the other hand, when input signals IN and/IN are at an "L" level and an "H" level, respectively, N channel MOS transistor 413 turns on, and data DQ becomes an "L" level or "0".

Correspondence between read data from memory array 100 and data DQ may be reversed. For example, it may be configured such that data DQ becomes "0" when P channel MOS transistor 412 is on and it becomes "1" when N channel MOS transistor 413 is on.

Figure 5:
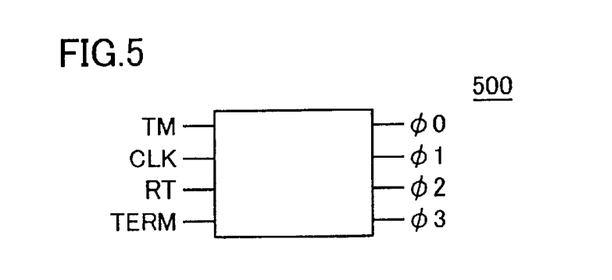
FIG. 5 is a circuit block diagram of a timing adjustment circuit generating timing signals.

Referring to FIG. 5, a timing adjustment circuit 500 generates timing signal φ0–φ3 for adjustment of CAS latency. It receives a test signal TM, a clock signal CLK, a read designation signal RT input in response to a data read command, and a read termination signal TERM input in response to a data read termination command, and generates the timing signals φ0–φ3.

Figure 6:
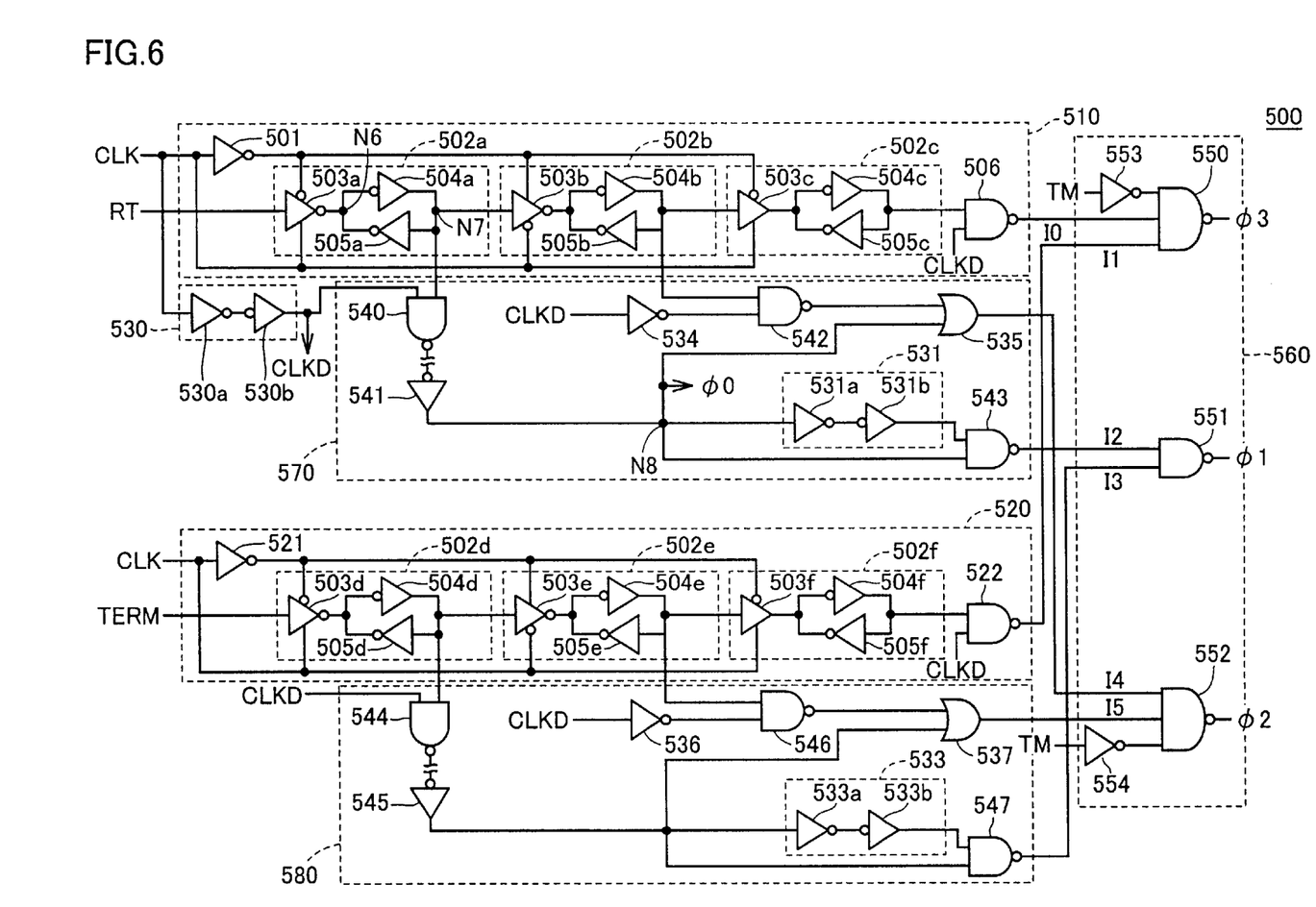
FIG. 6 is a circuit diagram of the timing adjustment circuit.

Referring to FIG. 6, timing adjustment circuit 500 includes an RT holding circuit 510, an RT signal adjustment circuit 570, a TERM holding circuit 520, a TERM signal adjustment circuit 580, a timing signal generation unit 560, and a clock signal CLKD generation unit 530.

RT holding circuit 510 latches read designation signal RT in response to clock signal CLK, and generates an internal timing signal I0.

TERM holding circuit 520 latches read termination signal TERM in response to clock signal CLK, and generates an internal timing signal I1.

RT signal adjustment circuit 570 adjusts timing of read designation signal RT, and generates internal timing signals I2 and I4.

TERM signal adjustment circuit 580 adjusts timing of read termination signal TERM, and generates internal timing signals I3 and I5.

Clock signal CLKD generation unit 530 is a delay unit which includes serially-connected two inverters 530a and 530b and delays the input signal by a prescribed time period before output. Thus, clock signal CLKD is a delayed version of clock signal CLK by the prescribed time period. Other delay units as will be described later have similar configurations, and description thereof will not be repeated.

RT holding circuit 510 latches read designation signal RT sequentially in response to rising and falling of clock signal CLK, and outputs internal timing signal I0 one clock cycle later.

RT holding circuit 510 has latch units 502a–502c, an inverter 501 and a NAND circuit 506.

Latch units 502a–502c and NAND circuit 506 are connected in series. Latch units 502a, 502b and 502c are connected in series, and they each have an input receiving clock signal CLK and another input receiving clock signal CLK via inverter 501. NAND circuit 506 receives an output signal of latch unit 502c and clock signal CLKD, and outputs their NAND operation result as internal timing signal I0. Here, clock signal CLKD having clock signal CLK delayed by a prescribed time period is provided to NAND circuit 506 for the purpose of adjusting the timing of the transmitted signal that is delayed by a prescribed time period as is latched by serially-connected latch units 502a–502c.

Latch unit 502a is now described.

Latch unit 502a latches read designation signal RT in response to clock signal CLK, and outputs a signal of the same polarity.

Latch unit 502a has a clocked inverter 503a, an inverter 504a and a small inverter 505a.

Clocked inverter 503a, in response to clock signal CLK input via inverter 501, inverts and transmits read designation signal RT to a node N6. Inverter 504a inverts the signal transmitted from node N6 for output to a node N7. Small inverter 505a inverts the signal transmitted from node N7 for output to node N6, thereby forming a latch. Latch unit 502a attains an activated state when clock signal CLK is at an "H" level, and latches read designation signal RT and outputs an output signal having the same polarity as read designation signal RT.

Thus, the output signal of latch unit 502a is latched to an "H" level when read designation signal RT is at an "H" level.

Latch unit 502b, in contrast to latch unit 502a, is activated when clock signal CLK input is at an "L" level. Latch unit 502c, like latch unit 502a, is activated when clock signal CLK is at an "H" level.

The operation at the time when read designation signal RT is at an "H" level is now described by way of example.

When clock signal CLK rises to an "H" level, latch unit 502a is activated to latch an "H" level. Next, when clock signal CLK falls to an "L" level, latch unit 502b is activated, and the "H" level transmitted from latch unit 502a is latched. Thereafter, when clock signal CLK rises again to an "H" level, latch unit 502c is activated, and the "H" level transmitted from latch unit 502b is latched.

Next, when clock signal CLKD rises to an "H" level, internal timing signal I0, which is the output signal of NAND circuit 506 is at an "L" level. That is, internal timing signal I0 is at an "L" level one clock cycle later than the rising of clock signal CLKD at time t1.

When read designation signal RT is at an "L" level, the signal being input from latch unit 502c to NAND circuit 506 is constantly at an "L" level, and thus, internal timing signal I0 is constantly at an "H" level.

TERM holding circuit 520, in response to rising and falling of clock signal CLK, sequentially latches read termination signal TERM and outputs internal timing signal I1 one clock cycle later than the rising of clock signal CLKD at time t3a.

TERM holding circuit 520 has latch units 502d–502f, an inverter 521, and a NAND circuit 522.

Although TERM holding circuit 520 has a configuration identical to that of RT holding circuit 510, it differs from RT holding circuit 510 in that it receives read termination signal TERM and outputs internal timing signal I1.

The operation at the time when read termination signal TERM is at an "H" level is described by way of example.

When clock signal CLK rises to an "H" level, latch unit 502d is activated and the "H" level is latched. Next, when clock signal CLK falls to an "L" level, latch unit 502e is activated and the "H" level output from latch unit 502d is latched. Thereafter, when clock signal CLK rises to an "H" level, latch unit 502f is activated and the "H" level output from latch unit 502e is latched. Next, when clock signal CLKD rises to an "H" level, the output signal of NAND circuit 522, or internal timing signal I1, attains an "L" level. That is, internal timing signal I1 it at an "L" level one clock cycle later than the rising of clock signal CLKD at time t3a.

When read termination signal TERM is at an "L" level, the signal being input from latch unit 502f to NAND circuit 522 is constantly at an "L" level, and thus, internal timing signal I1 is constantly at an "H" level.

RT signal adjustment circuit 570 is now described.

RT signal adjustment circuit 570 generates, based on read designation signal RT latched by latch units 502a and 502b, timing signal $\phi 0$ and internal timing signals I2 and I4 at prescribed timings, for timing adjustment of timing signals $\phi 1$ and $\phi 2$. More specifically, it adjusts the timing of falling of timing signal $\phi 0$ to match the timing of rising of internal timing signal I2. It also adjusts the timing of falling of timing signal $\phi 0$ to match the timing of falling of internal timing signal I4, and adjusts the timing of rising of internal timing signal I4 to match the timing of falling of internal timing signal I0.

RT signal adjustment circuit 570 includes NAND circuits 540, 542 and 543, inverters 534 and 541, a delay unit 531 and an OR circuit 535.

NAND circuit 540 receives clock signal CLKD and read designation signal RT having been latched by latch unit 502a in response to rising of clock signal CLK (to an "H" level), and outputs their NAND operation result to inverter 541. Although not shown, a delay unit for use in timing adjustment is connected in series between NAND circuit 540 and inverter 541.

Inverter 541 inverts the output signal of NAND circuit 540 and transmits it to a node N8. Here, the signal transmitted to node N8 is output as timing signal $\phi 0$.

NAND circuit 542 receives read designation signal RT latched by latch unit 502b and clock signal CLKD input via inverter 534, and outputs their NAND operation result to OR circuit 535. OR circuit 535 receives the output signal of NAND circuit 542 and the signal transmitted from node N8, and generates internal timing signal I4.

Here, timing signal $\phi 0$ is a one-shot pulse generated according to the NAND operation result of read designation signal RT (of an "H" level) latched by latch unit 502a and clock signal CLKD (of an "H" level). It passes through the delay unit, and becomes a signal whose signal waveform is delayed by a prescribed time period from that of read designation signal RT being input in synchronization with clock signal CLK.

At the timing of falling of timing signal $\phi 0$, in response to clock signal CLK (of an "L" level), read designation signal RT (of an "H" level) is latched to latch unit 502b.

Further, as described above, NAND circuit 540 receives clock signal CLKD and generates a one-shot pulse, which is passed through the delay unit, so that timing signal $\phi 0$ is generated. Thus, at the timing of falling of timing signal $\phi 0$, clock signal CLKD is at an "L" level.

Accordingly, the output signal of NAND circuit 542 is set to an "L" level when read designation signal RT (of an "H" level) is latched to latch unit 502b and clock signal CLKD is at an "L" level.

OR circuit 535 outputs an OR operation result of the output signal of NAND circuit 542 and the signal transmitted from node N8. Upon falling of timing signal $\phi 0$ to an "L" level, when clock signal CLKD is at an "L" level, the output signal of NAND circuit 542 is at an "L" level. Thus, internal timing signal I4 is set to an "L" level in response to falling of timing signal $\phi 0$ from an "H" level to an "L" level. Accordingly, the timing of falling of timing signal $\phi 0$ and the timing of falling of internal timing signal I4 are made to match with each other.

Rising of internal timing signal I4 is now considered.

NAND circuit 542, in response to next rising of clock signal CLKD (to an "H" Level), outputs the NAND operation result as an "H" level. In response, internal timing signal I4 is set to an "H" level.

As described above, in the state where read designation signal RT (of an "H" level) is being latched by latch unit 502b, in response to next rising of clock signal CLKD, read designation signal RT (of an "H" level) is latched at latch unit 502c and the output signal of NAND circuit 506, i.e., internal timing signal I0, falls. Thus, in response to the rising of clock signal CLKD (to an "H" level), the timing of falling of internal timing signal I0 and the timing of rising of internal timing signal I4 are matched with each other.

TERM signal adjustment circuit 580 is now described.

TERM signal adjustment circuit 580 carries out timing adjustment of timing signals $\phi 1$ and $\phi 2$ by generating internal timing signals I3 and I5 at prescribed timings based on read termination signal TERM input.

TERM signal adjustment circuit 580 includes NAND circuits 544, 546 and 547, inverters 536 and 545, a delay unit 533 and an OR circuit 537.

Although TERM signal adjustment circuit 580 has the same configuration as that of RT signal adjustment circuit 570, it differs from the circuit 570 in that it generates internal timing signals I3 and I5 based on the read termination signal TERM latched by latch units 502d and 502e, respectively.

The timings of falling and rising of internal timing signals I3 and I5 are identical to those of internal timing signals I2 and I4 described above.

Timing signal generation unit 560 is now described.

Timing signal generation unit 560 receives internal timing signals I0–I5 and a test signal TM, and outputs timing signals φ1–φ3.

Timing signal generation unit 560 includes NAND circuits 550–552 and inverters 553 and 554.

NAND circuit 550 receives timing signals φ0 and φ1 as well as test signal TM input via inverter 553, and generates timing signal φ3.

NAND circuit 551 receives internal timing signals I2 and I3, and generates timing signal φ1.

NAND circuit 552 receives internal timing signals I4 and I5 as well as test signal TM input via inverter 554, and outputs timing signal φ2.

Test signal TM is at an "H" level in a test mode, and at an "L" level in a normal operation mode.

Here, in the initial state, internal timing signals I0–I5 are all at an "H" level, and test signal TM being input via the inverters is also at an "H" level. Thus, timing signals φ0–φ3 are set to an "L" level.

Accordingly, in timing signal generation unit 560, internal timing signals I0–I5 selectively attain an "L" level, and corresponding timing signals φ1–φ3 attain an "H" level.

Figure 7:
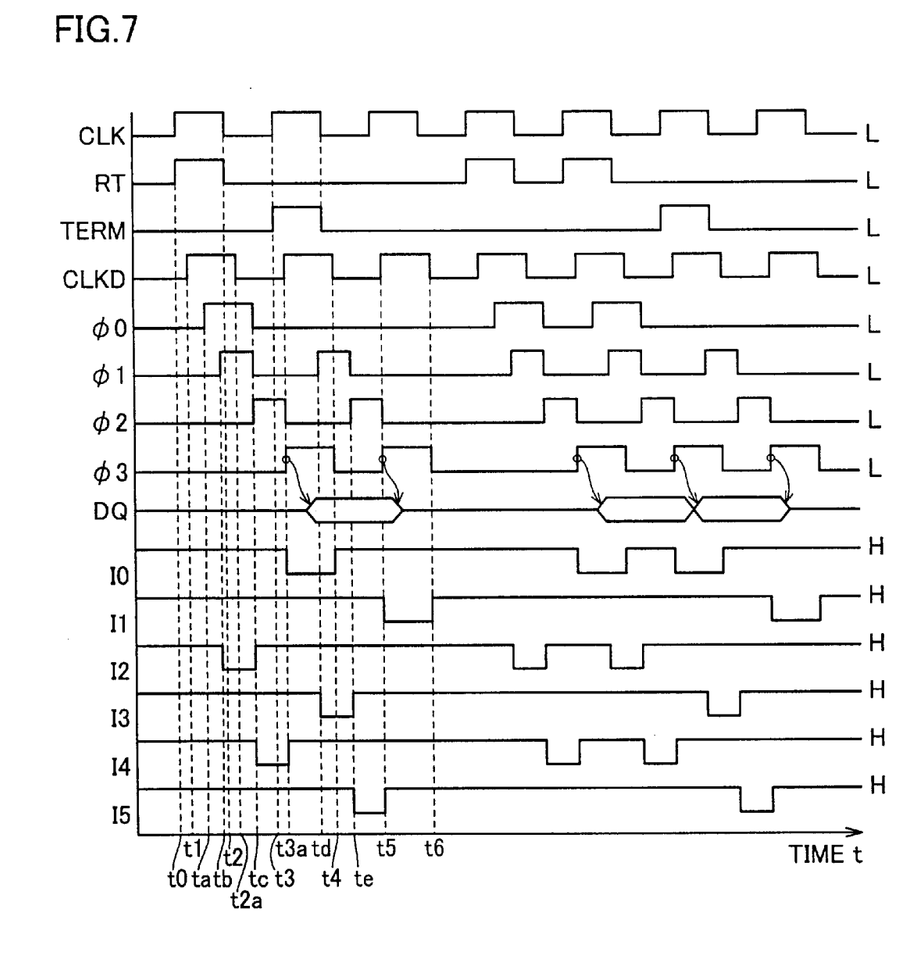
FIG. 7 is a timing chart of the synchronous semiconductor memory device in a normal operation.

FIG. 7 is a timing chart of synchronous semiconductor memory device 1000 in a normal operation mode.

Referring to FIGS. 6 and 7, a case of outputting one piece of data is described.

Read designation signal RT is input at time t0 in response to rising of clock signal CLK. Since only one piece of data is being read out, read termination signal TERM is input at next rising of clock signal CLK at time t3.

In RT holding circuit 510, clock signal CLK and read designation signal RT are both at an "H" level, so that latch unit 502a latches an "H" level.

In RT signal adjustment circuit 570, when the "H" level is latched at latch unit 502a and clock signal CLKD attains an "H" level at time t1, the NAND operation result of NAND circuit 540 becomes an "L" level, and the output signal of inverter 541 becomes an "H" level.

At time ta after a lapse of a prescribed delay time due to the delay unit, timing signal φ0 attains an "H" level.

Thus, in accordance with timing signal φ0, the data signal output from memory array 100 is amplified by preamplifier 200 and output to latch circuit 300a.

Next, at time tb after a lapse of a prescribed delay time due to delay unit 531, internal timing signal I2 falls to an "L" level. In response, timing signal φ1 rises to an "H" level.

Thus, in accordance with timing signal φ1, the data signal amplified by preamplifier 200 is latched at latch circuit 300a.

Next, at time tc, in response to falling of timing signal φ0, internal timing signal I2 rises to an "H" level. In response, timing signal φ1 falls to an "L" level.

Here, in RT holding circuit 510, clock signal CLK attains an "L" level at time t2, and latch unit 502b latches the "H" level transmitted from latch unit 502a.

Next, at time t2a, clock signal CLKD attains an "L" level, so that NAND circuit 542 outputs the NAND operation result of an "L" level.

Thus, at time tc, internal timing signal I4 being the output signal of OR circuit 535 attains an "L" level corresponding to the falling of timing signal φ0. In response, timing signal φ2 rises to an "H" level.

In response to the rising of timing signal φ2 (to an "H" level), the data signal latched by latch circuit 300a is latched to latch circuit 300b.

Next, at time t3, clock signal CLK attains an "H" level, and latch unit 502c of RT holding circuit 510 latches read designation signal RT (of an "H" level) having been latched at latch unit 502b.

Next, at time t3a, when clock signal CLKD attains an "H" level, the NAND operation result of NAND circuit 506, i.e., internal timing signal I0, attains an "L" level. In response, timing signal φ3 attains an "H" level.

Thus, in accordance with timing signal φ3, the data signal latched at latch circuit 300b is latched by output circuit 400.

Output circuit 400 finally outputs data DQ according to the latched data signal.

At time t3, read termination signal TERM is input.

In this case, similar to the case of read designation signal RT, internal timing signals I1, I3 and I5 are generated by TERM holding circuit 520 and TERM signal adjustment circuit 580.

Next, at time td after a lapse of a prescribed delay time due to delay unit 533, internal timing signal I3 falls to an "L" level. In response, timing signal φ1 rises to an "H" level.

Next, at time te, in response to rising of internal timing signal I3 (to an "H" level), internal timing signal I5 falls to an "L" level. In response, timing signal φ2 rises to an "H" level.

Next, at time t5, in response to rising of clock signal CLKD, timing signal φ3 rises to an "H" level.

As such, timing signals φ1–φ3 sequentially rise to activate latch circuits 300a–300b and output circuit 400. However, since preamplifier 200 is not in an activated state, input signals IN and/IN each in the initial state of an "L" level are input to output circuit 400. In output circuit 400, P channel MOS transistor 412 and N channel MOS transistor 413 are both turned off, and reading of data DQ is terminated.

Although reading of one piece of data has been described above, two consecutive pieces of data can be read out in the same manner. In such a case, two pulses of read designation signal RT are input in response to clock signal CLK.

Correspondingly, timing signals φ0–φ3 rise in different timings, so that data are latched in sequence, thereby enabling burst reading.

Termination of the data reading is designated by input of read termination signal TERM.

Next, an operation in a test mode is described.

Figure 8:
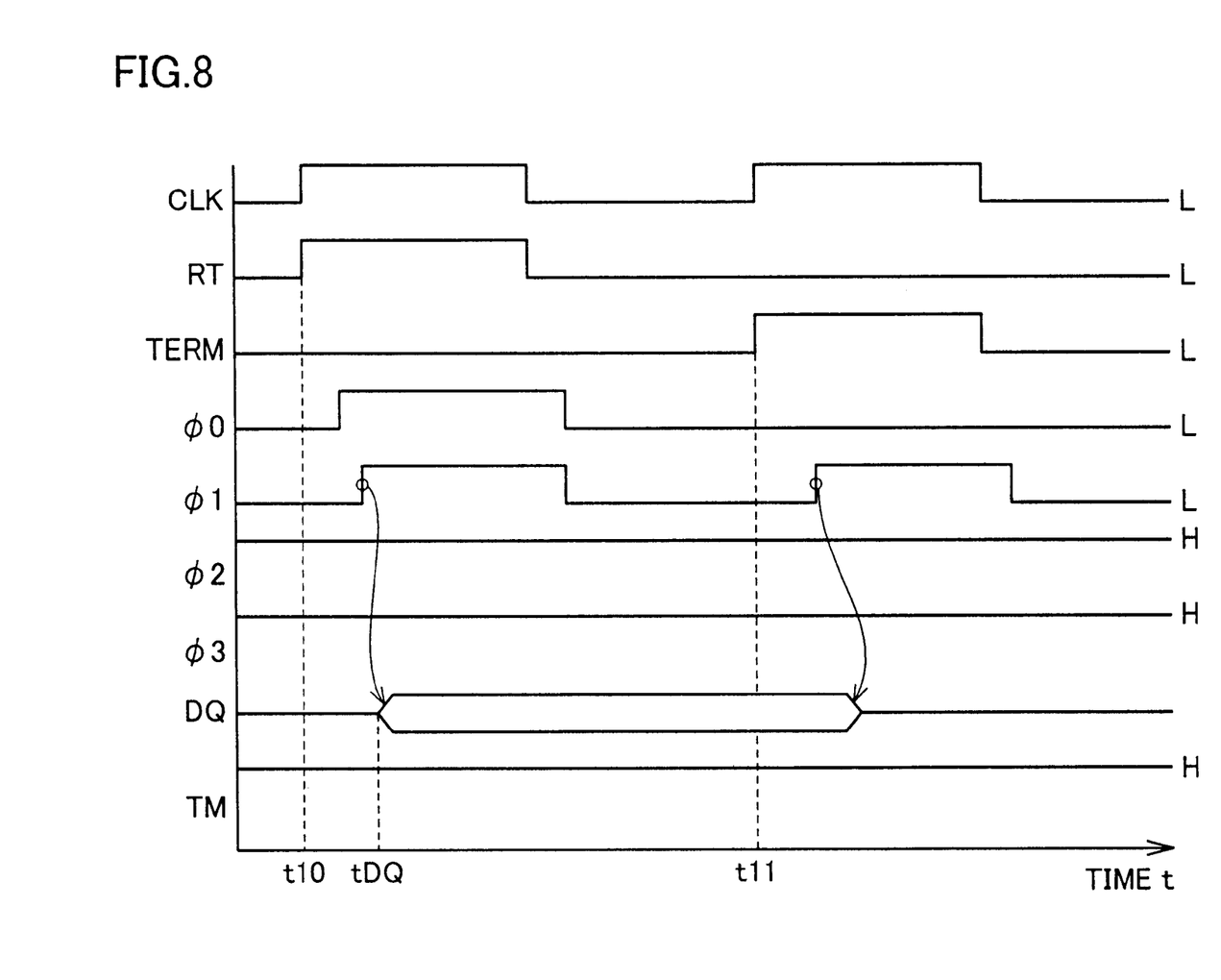
FIG. 8 is a timing chart of the synchronous semiconductor memory device in a test mode.

FIG. 8 is a timing chart of synchronous semiconductor memory device 1000 in the test mode.

Referring to FIG. 8, description is given for a case of reading one piece of data in the test mode.

Test signal TM is set at an "H" level.

When test signal TM is at an "H" level, timing signals φ2 and φ3 generated in timing adjustment circuit 500 are constantly at an "H" level of an activated state.

At time t10, read designation signal RT is input to timing adjustment circuit 500 in synchronization with clock signal CLK.

Timing signal φ0 attains an "H" level after a lapse of a prescribed delay time due to a delay unit. The data signal output from memory array 100 is amplified and output to latch circuit 300a.

Timing signal φ1 attains an "H" level after a lapse of a prescribed time from the rising of timing signal φ0 due to delay unit 531, and the data signal is latched.

Timing signals φ2 and φ3 are constantly at an active state because of test signal TM being input. Thus, the data signal is directly input to output circuit 400.

Output circuit 400 outputs data DQ in response to the data signal latched by latch circuit 300a.

The time period from time t10 when data reading is designated to time tDQ when data DQ is output corresponds to a signal propagation delay time of the data signal.

Next, at time t11, read termination signal TERM is input to timing adjustment circuit 500 in synchronization with clock signal CLK.

Timing signal φ1 attains an "H" level after a lapse of a prescribed time due to delay unit 533.

In response, latch circuit 300a is activated, and input signals IN and /IN both at an "L" level received from preamplifier 200 are output to output circuit 400. In response, output circuit 400 terminates reading of data DQ.

Accordingly, in the test mode, by setting timing signals φ2 and φ3 to an "H" level with test signal TM, the output of output circuit 400 can be controlled in accordance with timing signal φ1.

As such, according to the configuration described above, it is possible to shorten the long stand-by period corresponding to the CAS latency that was required in a conventional wafer test for detection of defects with a low-speed clock.

Further, since data can be output asynchronous to clock signal CLK, CAS latency is 0. Accordingly, a test time required for detection of defective read data in a wafer test can be reduced.

In the present embodiment, the configuration of a synchronous DRAM being a synchronous semiconductor memory device performing data input/output in synchronization with a clock signal has been described. However, the configuration of the present invention is also applicable to an asynchronous semiconductor memory device that does not synchronize with a clock signal.

Further, while the configuration having two stages of latch circuits has been described above, any number of stages of latch circuits may be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a memory array storing data;

a data output circuit transmitting read data output from said memory array to a data output node; and a latency setting circuit adjusting a data transmission period from a time when a data reading operation is designated to a time when said read data is transmitted to said data output node by controlling an operation timing of said data output circuit, said latency setting circuit setting said data transmission period shorter in a test mode than in a normal data reading operation.

2. The semiconductor memory device according to claim 1, wherein said data output circuit includes serially connected N latch circuits from a first stage to an Nth stage transmitting said read data from said memory array, wherein N is a natural number, and an output buffer setting a voltage level of said data output node in response to an output of the latch circuit in the last stage among said N latch circuits, said N latch circuits are each set to an operating state at a respective prescribed timing, and in said operating state, each said latch circuit transmits said read data transmitted from the preceding stage to the succeeding stage.

3. The semiconductor memory device according to claim 2, wherein in said test mode, said memory array outputs said read data to said data output circuit under a condition that each of said N latch circuits in said data output circuit is set to said operating state.

4. The semiconductor memory device according to claim 1, performing said data reading operation in synchronization with a clock signal, wherein said data transmission period set by said latency setting circuit corresponds to an integral multiple of a period of said clock signal.

5. The semiconductor memory device according to claim 4, wherein in said test mode, said latency setting circuit sets said data transmission period to a zero multiple of the period of said clock signal.

6. The semiconductor memory device according to claim 1, wherein in said test mode, said data transmission period corresponds to a propagation delay of said read data which occurs between said memory array and said data output node.

* * * * *